US006485833B1

(12) United States Patent
Imashiro et al.

(10) Patent No.: US 6,485,833 B1
(45) Date of Patent: Nov. 26, 2002

(54) RESIN-COATED METAL FOIL

(75) Inventors: Yasuo Imashiro, Chiba (JP); Takahiko Ito, Chiba (JP); Hideshi Tomita, Chiba (JP); Norimasa Nakamura, Chiba (JP)

(73) Assignee: Nisshinbo Industries, Inc., Tokyo (JP)

( * ) Notice: Subject to any disclaimer, the term of this patent is extended or adjusted under 35 U.S.C. 154(b) by 46 days.

(21) Appl. No.: 09/692,423

(22) Filed: Oct. 20, 2000

(30) Foreign Application Priority Data

Dec. 16, 1999 (JP) ............................................ 11-358007

(51) Int. Cl.[7] .............................................. B32B 27/38
(52) U.S. Cl. ........................ 428/413; 428/416; 428/457; 428/458
(58) Field of Search .............................. 428/413, 416, 428/457, 458

(56) References Cited

U.S. PATENT DOCUMENTS 4,118,536 A * 10/1978 Beardsley ................... 428/413
4,337,107 A * 6/1982 Eshleman ................... 156/249

* cited by examiner

Primary Examiner—Leszek Kiliman
(74) Attorney, Agent, or Firm—Kubovcik & Kubovcik

(57) ABSTRACT

A resin-coated metal foil comprising:
  a metal foil, and
  a resin layer formed on the metal foil by coating and semi-curing, on the metal foil, a composition containing a polycarbodiimide resin having a number-average molecular weight of 3,000 to 50,000, an epoxy resin, the proportions of the polycarbodiimide resin and the epoxy resin being 100 parts by weight and 20 to 2000 parts by weight, respectively. In the resin-coated metal foil, the resin is superior in handleability and storage stability in a semi-cured state and, after complete cure, high in heat resistance and superior in dielectric properties.

7 Claims, No Drawings

RESIN-COATED METAL FOIL

BACKGROUND OF THE INVENTION

1. Field of the Invention

The present invention relates to a resin-coated metal foil suitable for use particularly as a material for multi-layered printed wiring board. More particularly, the present invention relates to a copper foil coated with a resin which is superior in handleability and storage stability in a semi-cure state and, after complete cure, high in heat resistance and superior in dielectric properties.

2. Description of the Prior Art

Conventional resin-coated metal foils are obtained by coating, on a metal foil, an insulating resin varnish (a solution of an epoxy resin and a curing agent such as dicyandiamide or the like in a solvent) and semi-curing the insulating resin varnish into a B-stage by heating and drying. Thus obtained conventional resin-coated metal foils have been used in production of a multi-layered printed wiring board by laminating the resin-coated metal foils with a substrate for inner layer obtained by formation of a circuit pattern and subjecting the laminate to molding.

However, the resin-coated metal foils used in above production of the multi-layered printed wiring board have had, during the production (for example, when an external pressure is applied in winding by rolls), problems of generation of cracking or peeling in B-stage resin and scattering of powder in cutting of the resin-coated metal foil.

Conventional resin-coated metal foils have had another problem in that the resin after complete cure has low heat resistance. All of these problems have remained undissolved.

OBJECT AND SUMMERY OF THE INVENTION

In view of the above-mentioned problems of the prior art, the present invention aims at providing a resin-coated metal foil which is superior in handleability and storage stability in a semi-cure state and, after complete cure, high in heat resistance and superior in dielectric properties.

The present inventors thought of an idea that when a composition containing a polycarbodiimide resin of good film formability and an epoxy resin is coated and semi-cured on a metal foil, the resulting resin-coated metal foil may be superior in handleability and, when the semi-cured resin is completely cured, the resin may have high heat resistance owing to the reaction between carbodiimide group and epoxy group or the self-crosslinking reaction of carbodiimide group and moreover may have excellent dielectric properties owing to the polycarbodiimide resin. Based on the idea, the present inventors made a study and completed the present invention.

According to the present invention, there is provided a resin-coated metal foil comprising:

a metal foil, and a resin layer formed on the metal foil by coating and semi-curing, on the metal foil, a composition containing a polycarbodiimide resin having a number-average molecular weight of 3,000 to 50,000, an epoxy resin and, as necessary, a curing agent for epoxy resin, the proportions of the polycarbodiimide resin and the epoxy resin being 100 parts by weight and 20 to 200 parts by weight, respectively.

DETAILED DESCRIPTION OF THE INVENTION

The present invention is described in detail below.

In the present invention, the composition used for forming a resin layer on a metal foil contains a polycarbodiimide resin and an epoxy resin, or contains a polycarbodiimide resin, an epoxy resin and a curing agent for epoxy resin. As the polycarbodiimide resin, there can be used those produced by various processes. There can be used an isocyanate-terminated polycarbodiimide produced basically by a conventional process for production of polycarbodiimide resin [U.S. Pat. No. 2,941,956; J. Org. Chem., 28, 2069–2075 (1963); Chemical Review 1981, Vol. 81, No. 4, pp. 619–621], and specifically by a condensation reaction of organic polyisocyanate, associated with carbon dioxide removal.

In the above process, as the organic polyisocyanate which is a raw material for synthesis of polycarbodiimide resin, there can be used, for example, aromatic polyisocyanates, aliphatic polyisocyanates, alicyclic polyisocyanates and mixtures thereof. Specific examples are 1,5-naphhtalene diisocyanate, 4,4'-diphenylmethane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, a mixture of 2,4-tolylene diisocyanate and 2,6-tolylene diisocyanate, hexamethylene diisocyanate, cyclohexane-1,4-diisocyanate, xylylene diisocyanate, isophorone diisocyanate, dicyclohexylmethane-4-4'-diisocyanate, methylcyclohexane diisocyanate, tetramethylxylylene diisocyanate, 2,6-diisopropylphenyl diisocyanate and 1,3,5-triisopropylbenzene-2,4-diisocyanate.

As the polycarbodiimide resin used in the present invention, there is preferred a polycarbodiimide obtained from at least one kind of aromatic polyisocyanate. (Incidentally, the aromatic polyisocyanate refers to an isocyanate containing, in the molecule, at least two isocyanate groups directly bonding to the aromatic ring). The reason is that the polycarbodiimide obtained from at least one kind of aromatic polyisocyanate is thermosetting and has film formability The above polycarbodiimide resin may have an appropriately controlled polymerization degree by using a compound reactive with the terminal isocyanate of carbodiimide compound, for example, a monoisocyanate.

As the monoisocyanate for terminal blocking of polycarbodiimide and control of the polymerization degree, there can be mentioned, for example, phenyl isocyanate, tolyl isocyanate, dimethylphenyl isocyanate, cyclohexyl isocyanate, butyl isocyanate and naphthyl isocyanate.

As the compound reactive with the terminal isocyanate of polycarbodiimide, there can also be used, for example, aliphatic, aromatic or alicyclic compounds having -OH group (e.g. methanol, ethanol, phenol, cyclohexanol, N-methylethanolamine, polyethylene glycol monomethyl ether and polypropylene glycol monomethyl ether), =NH group (e.g. diethylamine and dicyclohexylamine), —NH$_2$ group (e.g. butylamine and cyclohexylamine), —COOH group (e.g. propionic acid, benzoic acid and cyclohexanecarboxylic acid), —SH group (e.g. ethylmercaptan, allylmercaptan and thiophenol), epoxy group or the like.

The decarboxylative condensation of organic polyisocyanate proceeds in the presence of a carbodiimidization catalyst. As the carbodiimidization catalyst, there can be used, for example, phosphorene oxides such as 1-phenyl-2- phosphorene-1-oxide, 3-methyl-1-phenyl-2-phosphorene-1-oxide, 1-ethyl-2-phosphorene-1-oxide, 3-methyl-2-phosphorene-1-oxide, 3-phosphorene isomers thereof and the like. Of these, 3-methyl-1-phenyl-2-phosphorene-1-oxide is preferred from the reactivity.

The polycarbodiimide resin used in the present invention has a number-average molecular weight of 3,000 to 50,000, preferably 10,000 to 30,000, more preferably 15,000 to 25,000 (in terms of polystyrene conversion) as measured by gel permeation chromatography (GPC), irrespective of the use of a terminal-blocking agent. When the number-average molecular weight is less than 3,000, no sufficient film formability or heat resistance is obtained. When the number-average molecular weight is more than 50,000, a long time is required for synthesis of polycarbodiimide, a varnish of the resulting polycarbodiimide resin has an extremely short pot life. Therefore, such molecular weights are not practical.

As the epoxy resin used in the composition in the present invention, there can be mentioned, for example, at least one kind of epoxy resin having at least two epoxy groups in the molecule or a mixture of such epoxy resins, all selected from glycidyl ether type epoxy resins (e.g. bisphenol A type epoxy resin, bisphenol F type epoxy resin, phenol novolac type epoxy resin and cresol novolac type epoxy resin), alicyclic epoxy resins, glycidyl ester type epoxy resins, heterocyclic epoxy resins, liquid rubber-modified epoxy resins, and so forth. Preferred are bisphenol A type epoxy resin, bisphenol F type epoxy resin, phenol novolac type epoxy resin and cresol novolac type epoxy resin. The epoxy resin used in the present invention is not restricted to these, and generally known epoxy resins can be used.

The first form of the composition used in the present invention contains a polycarbodiimide resin and an epoxy resin as the essential components. The proportions of the two resins are such that the polycarbodiimide resin is 100 parts by weight and the epoxy resin is 20 to 200 parts by weight, preferably 40 to 150 parts by weight, more preferably 50 to 100 parts by weight. When the proportion of the epoxy resin is less than 20 parts by weight, the properties of the epoxy resin hardly appear. When the proportion of the epoxy resin is more than 200 parts by weight, the resulting composition has inferior film formability. Therefore, such proportions are not desirable.

In the first form of the composition containing a polycarbodiimide resin and an epoxy resin as the essential components, other resin and additives may be used as long as the use does not adversely affect the properties of the resin layer formed after semi-cure or after complete cure.

The second form of the composition used in the present invention contains a polycarbodiimide resin, an epoxy resin and a curing agent for epoxy resin, as the essential components. The proportions of the polycarbodiimide resin and the epoxy resin are the same as in the first form of the composition.

The curing agent for epoxy resin used in the second form of the composition, preferably has a melting point of 50° C. or higher because such a curing agent has mild reactivity and good handleability. Specific examples of such a curing agent are imidazoles such as 2-phenylimidazole, 1-cyanoethyl-2-undecylimidazole, 1-cyanoethyl-2-phenyl -imidazole, Curezole 2MZA-PW (trade name, product of Shikoku Chemicals Corporation), Curezole 2E4MZ-CNS (trade name, product of Shikoku Chemicals Corporation), Curezole 2E4MZ-A (trade name, product of Shikoku Chemicals Corporation) and the like; dihydrazides such as adipic acid dihydrazide, sebacic acid dihydrazide, dodecanoic acid dihydrazide, 2,6-naphthalene dihydrazide, isophthalic acid dihydrazide, p -oxybenzoic acid dihydrazide, salicylic acid dihydrazide, N -phenyliminopropionic acid dihydrazide and the like; dicyandiamide; melamine and derivatives thereof; Curezole ZLW-2A (trade name, product of Shikoku Chemicals Corporation); urea derivatives; and guanidine derivatives.

Of the above curing agents for epoxy resin, preferred are 2,6-naphthalene dihydrazide, Curezole ZLW-2A, Curezole 2MZA-PW and melamine because the resulting resin-coated metal foil has improved heat resistance and dielectric properties.

The curing agent is used in an amount of preferably 1.0 equivalent or less relative to the epoxy resin. When the amount is more than 1.0 equivalent, the resin after complete cure may have decreased properties in heat resistance, etc.

The method for obtaining the composition used in the present invention by mixing individual components has no particular restriction, and a mixer, a three-roll mill or the like can be used.

In producing the resin-coated metal foil of the present invention, first, the composition obtained as above is coated on a metal foil. As to the metal foil used in the present invention, there is no particular restriction as long as it is usable in production of multi-layered printed wiring board. However, a copper foil (in particular, an electrolytic copper foil) is preferred for the easiness in use and the cost.

As to the method for coating the composition on a metal foil, there is no particular restriction, and a known method using an appropriate coater can be used. As necessary, the composition may be concentrated for adjustment of the viscosity.

The composition coated on a metal foil is semi-cured to convert into a resin layer, whereby a resin-coated metal foil of the present invention can be obtained. The semi-cure of the composition is conducted preferably by heat-drying. As the apparatus for the heat-drying, an ordinary apparatus such as hot-air drying oven or the like can be used. The heat-drying may be conducted while continuously coating the composition on a metal foil.

The temperature of the heat-drying is, for example, 60 to 200° C., preferably 70 to 180° C. The drying time is, for example, 1 to 60 minutes, preferably 3 to 30 minutes although it differs depending upon the drying temperature and the constitution of the composition. The thus-formed resin layer has a thickness of, for example, 10 to 200 μm, preferably 30 to 100 μm.

The resin-coated metal foil obtained as above, of the present invention is laminated with a substrate for inner layer obtained by formation of circuit pattern and subsequent blackening treatment, with the resin-coated side being allowed to face the substrate, and the laminate is subjected to molding under heat and pressure, whereby a multi-layered printed wiring board superior in reliability can be obtained.

The present invention is described in more detail below by way of Examples. However, the present invention is not restricted by the Examples.

EXAMPLE 1

In a reactor provided with a stirrer and a condenser were placed 1,720 g of 4,4'-diphenylmethane diisocyanate (hereinafter referred to as MDI), 16.4 g of phenyl isocyanate (hereinafter referred to as PI), 12.9 kg of tetrahydrofuran (hereinafter referred to as THF) as a solvent and 3.44 g of 3-methyl-1-phenyl-2-phosphorene-1-oxide as a catalyst. A reaction was conducted under refluxing, for 16 hours, whereby was obtained a varnish containing a polycarbodiimide having a number-average molecular weight of 2.0× $10^4$ (in terms of polystyrene conversion) as measured by gel permeation chromatography (GPC). To the polycarbodiimide varnish was added 70 parts by weight, based on 100 parts by weight of the polycarbodiimide, of Epikote 828 (trade name, epoxy resin produced by Yuka Shell Epoxy K.K.). They were mixed into a uniform mixture. The uniform mixture was concentrated until a viscosity of 4 Pa.s was reached. The concentrate was cast on an electrolytic copper foil [YGP-18 (trade name), product of Nihon Denkai K.K.] using a coater; then, heat-drying was conducted at 60° C. for 5 minutes and at 70° C. for 10 minutes to give rise to semi-cure; thereby, a resin-coated copper foil having a resin layer of 100 µm in thickness was produced. This resin-coated copper foil was heated at 200° C. for 1 hour, after which the copper foil was removed by etching to obtain a film-like resin.

EXAMPLE 2

An operation was conducted in the same manner as in Example 1 except that the amount of the epoxy resin used was changed to 50 parts by weight based on 100 parts by weight of the polycarbodiimide resin.

EXAMPLE 3

An operation was conducted in the same manner as in Example 1 except that 0.6 equivalent, relative to the epoxy resin, of 2,6-naphthalene dihydrazide was added. Incidentally, the epoxy resin and the 2,6-naphthalene dihydrazide were beforehand mixed with each other sufficiently using a three-roll mill.

EXAMPLE 4

An operation was conducted in the same manner as in Example 1 except that 0.3 equivalent, relative to the epoxy resin, of Curezole ZLW-2A (trade name, product of Shikoku Chemicals Corporation) was added. Incidentally, the epoxy resin and the ZLW-2A were beforehand mixed with each other sufficiently using a three-roll mill.

EXAMPLE 5

An operation was conducted in the same manner as in Example 1 except that there was used, as the epoxy resin, a cresol novolac type epoxy resin [ESCN-195XL (trade name), product of Sumitomo Chemical Co., Ltd.] in an amount of 70 parts by weight based on 100 parts by weight of the polycarbodiimide resin.

EXAMPLE 6

In a reactor provided with a stirrer and a condenser were placed 2,100 g of tolylene diisocyanate, 28.7 g of PI, 14.3 kg of tetrachloroethylene as a solvent and 4.2 g of 3-methyl-1-phenyl-2-phosphorene-1-oxide as a catalyst. A reaction was conducted under refluxing, for 4 hours, whereby was obtained a varnish containing a polycarbodiimide having a number-average molecular weight of $1.0 \times 10^4$ (in terms of polystyrene conversion) as measured by GPC. To the polycarbodiimide varnish was added 70 parts by weight, based on 100 parts by weight of the polycarbodiimide, of Epikote 828 (trade name, epoxy resin produced by Yuka Shell Epoxy K.K.). They were mixed into a uniform mixture. The uniform mixture was concentrated until a viscosity of 4 Pa.s was reached. The concentrate was cast on an electrolytic copper foil [YGP-18 (trade name), product of Nihon Denkai K.K.] using a coater; then, heat-drying was conducted at 70° C. for 5 minutes and at 120° C. for 10 minutes to give rise to semi-cure; thereby, a resin-coated copper foil having a resin layer of 110 µm in thickness was produced. This resin-coated copper foil was heated at 200° C. for 1 hour, after which the copper foil was removed by etching to obtain a film-like resin.

Comparative Example 1

An operation was conducted in the same manner as in Example 1 except that the amount of the epoxy resin used was increased to 300 parts by weight based on 100 parts by weight of the polycarbodiimide resin.

Comparative Example 2

In a reactor provided with a stirrer and a condenser were placed 1,000 g of MDI, 119 g of PI, 8.6 kg of THF and 2.2 g of 3-methyl-1-phenyl-2-phosphorene-1-oxide as a catalyst. A reaction was conducted under refluxing, for 10 hours, whereby was obtained a varnish containing a polycarbodiimide having a number-average molecular weight of $2.1 \times 10^3$ (in terms of polystyrene conversion) as measured by GPC. To the polycarbodiimide varnish was added 70 parts by weight, based on 100 parts by weight of the polycarbodiimide, of Epikote 828 (trade name, epoxy resin produced by Yuka Shell Epoxy K.K.). They were mixed into a uniform mixture. The uniform mixture was concentrated until a viscosity of 3.5 Pa.s was reached. The concentrate was cast on an electrolytic copper foil [YGP-18 (trade name), product of Nihon Denkai K.K.] using a coater; then, heat-drying was conducted at 60° C. for 5 minutes and at 70° C. for 10 minutes to give rise to semi-cure; thereby, a resin-coated copper foil having a resin layer of 100 µm in thickness was produced. This resin-coated copper foil was heated at 200° C. for 1 hour, after which the copper foil was removed by etching to obtain a film-like resin.

Comparative Example 3

An epoxy resin varnish having the following composition was cast on an electrolytic copper foil [YGP-18 (trade name), product of Nihon Denkai K.K.]. Then, heat-drying was conducted at 120° C. for 10 minutes and at 170° C. for 10 minutes to give rise to semi-cure, whereby was produced a resin-coated copper foil having a resin layer of 100 µm in thickness.

| Epoxy resin varnish | |
|---|---|
| Epikote 828 (trade name) | 100 parts by weight |
| Dicyandiamide | 6 parts by weight |
| Methyl ethyl ketone | 40 parts by weight |
| DMF | 10 parts by weight |

The resin-coated copper foils and resins after complete cure, all obtained above were measured for properties according to the following test methods. The results are shown in Table 1.

Dielectric Constant and Dielectric Loss Tangent

The dielectric constant and dielectric loss tangent of a resin after complete cure were measured at 1 MHz using a HP-4284A type LCR meter (product of Hewlett-Packard Co.) according to JIS K 6911.

Glass Transition Temperature

The glass transition temperature of a resin after complete cure was measured using Rheolograph Solid (trade name, product of Toyo Seiki). The sample size was 30 mm×5 mm×0.1 mm; the temperature elevation rate was 5° C./min; the frequency was 10 Hz; and the peak top of tan δ was taken as glass transition temperature (Tg).

Resistances

The surface resistance and volume resistance of a resin after complete cure were measured using a 4239 A type high resistance meter (product of Yokogawa-Hewlett-Packard, Ltd.) according to JIS C 6481.

TABLE 1

|  | Examples | | | | | | Comparative Examples | | |
| --- | --- | --- | --- | --- | --- | --- | --- | --- | --- |
|  | 1 | 2 | 3 | 4 | 5 | 6 | 1 | 2 | 3 |
| Dielectric constant | 3.6 | 3.5 | 3.3 | 3.1 | 3.9 | 3.8 | 4.3 | 3.9 | 4.5 |
| Dielectric loss tangent | 0.008 | 0.007 | 0.006 | 0.008 | 0.009 | 0.007 | 0.01 | 0.009 | 0.03 |
| Tg (° C.) | >250 | >250 | >250 | >250 | >250 | >240 | >155 | >130 | >170 |
| Surface resistance ($\Omega$) | >$10^{15}$ | >$10^{15}$ | >$10^{15}$ | >$10^{15}$ | >$10^{15}$ | >$10^{15}$ | >4 × $10^{14}$ | >$10^{15}$ | >$10^{15}$ |
| Volume resistance ($\Omega \cdot$ cm) | >$10^{16}$ | >$10^{16}$ | >$10^{16}$ | >$10^{16}$ | >$10^{16}$ | >$10^{16}$ | >2 × $10^{15}$ | >$10^{16}$ | >$10^{16}$ |
| Appearance of resin-coated copper foil[a)] | ○ | ○ | ○ | ○ | ○ | ○ | X | X | ○ |
| Storage stability of resin-coated copper foil[b)] | >3 months | >3 months | >3 months | >3 months | >3 months | >3 months | —[c)] | —[c)] | <1 month |

[a)]Appearance was evaluated visually according to the following standard.
○: Surface is smooth and there is no residual foam or the like.
X: Surface has tack.
[b)]Resin-coated copper foil was stored at 20° C. and 65% R. H., and there was examined a time until the copper foil showed cracking when bent by 180°.
[c)]No storage stability evaluation was conducted because of inferior appearance.

The resin-coated metal foil of the present invention comprises a metal foil and a resin layer formed on the metal foil by coating and semi-curing, on the metal foil, a composition containing a polycarbodiimide resin, an epoxy resin and, as necessary, a curing agent for epoxy resin. As is clear from Table 1, the surface of the resin layer is smooth and free from tack in a semi-cure state; therefore, the resin-coated metal foil causes no foil-to-foil adhesion, for example, when wound by rolls, causes no cracking of resin when bent, thus has excellent handleability in a semi-cure state of resin.

The excellent handleability in a semi-cure state, i.e. no cracking of resin when bent is maintained over a long period of time; therefore, the resin-coated metal foil of the present invention is superior also in storage stability in a semi-cure state.

The resin-coated metal foil of the present invention is also superior in heat resistance and dielectric properties after complete cure of resin; therefore, the present resin-coated metal foil has high industrial applicability in view of its utilization in multi-layered printed wiring board production.

What is claimed is:

1. A resin-coated metal foil comprising:

a metal foil, and a resin layer formed on the metal foil by coating and semi-curing, on the metal foil, a composition containing a polycarbodiimide resin having a number-average molecular weight of 3,000 to 50,000 and an epoxy resin, the proportions of the polycarbodiimide resin and the epoxy resin being 100 parts by weight and 20 to 200 parts by weight, respectively.

2. A resin-coated metal foil comprising:

a metal foil, and a resin layer formed on the metal foil by coating and semi-curing, on the metal foil, a composition containing a polycarbodiimide resin having a number-average molecular weight of 3,000 to 50,000, an epoxy resin and a curing agent for epoxy resin, the proportions of the polycarbodiimide resin and the epoxy resin being 100 parts by weight and 20 to 200 parts by weight, respectively.

3. A resin-coated metal foil according to claim 1, wherein the polycarbodiimide resin is obtained from at least one kind of aromatic polyisocyanate.

4. A resin-coated metal foil according to claim 2, wherein the curing agent has a melting point of 50° C. or more.

5. A resin-coated metal foil according to claim 2, wherein the curing agent is used in an amount of 1.0 equivalent or less relative to the epoxy resin.

6. A resin-coated metal foil according to claim 1 or 2, wherein the metal foil is a copper foil.

7. A resin-coated metal foil according to claim 2, wherein the polycarbodiimide resin is obtained from at least one kind of aromatic polyisocyanate.

* * * * *